United States Patent

Tsutsumi et al.

[15] 3,663,870

[45] May 16, 1972

[54] SEMICONDUCTOR DEVICE PASSIVATED WITH RARE EARTH OXIDE LAYER

[72] Inventors: Tadashi Tsutsumi, Tokyo; Takeshi Matsuo, Yokohama-shi, both of Japan

[73] Assignee: Tokyo Shibaura Electric Co., Ltd., Kawasaki-shi, Japan

[22] Filed: Nov. 10, 1969

[21] Appl. No.: 875,223

[30] Foreign Application Priority Data

Nov. 13, 1968 Japan....................................43/82578
Oct. 21, 1969 Japan....................................44/83606

[52] U.S. Cl.........................317/235 R, 204/192, 317/235 B, 317/235 AG, 317/235 AZ

[51] Int. Cl..........................H01l 3/00, H01l 5/06, H01l 7/58

[58] Field of Search...................317/235 B, 235 AG, 235 AZ

[56] References Cited

UNITED STATES PATENTS

| | | | |
|---|---|---|---|
| 3,386,163 | 6/1968 | Brennemann et al. | 29/571 |
| 3,387,999 | 6/1968 | Hacskaylo et al. | 317/258 |
| 3,442,701 | 5/1969 | Lepselter | 117/212 |
| 3,455,020 | 7/1969 | Dawson et al. | 29/571 |
| 3,470,018 | 9/1969 | Smith et al. | 317/258 X |
| 3,471,756 | 10/1969 | McAfee | 317/258 X |
| 3,491,433 | 1/1970 | Kawamura et al. | 317/258 X |
| 3,496,433 | 2/1970 | Siegrist | 317/258 |
| 3,503,813 | 3/1970 | Yamamoto | 148/187 |
| 3,202,891 | 8/1965 | Frankl | 317/237 X |
| 3,544,865 | 12/1970 | Holtzberg et al. | 317/237 |
| 3,567,308 | 3/1971 | Ahn et al. | 317/235 A G |

*Primary Examiner*—John W. Huckert
*Assistant Examiner*—William D. Larkins
*Attorney*—Flynn & Frishauf

[57] ABSTRACT

In a semiconductor device comprising a semiconductor substrate, at least one junction dividing the substrate into at least two regions to define an interface therebetween, the end of the junction being exposed on a surface of the substrate, and an insulating film covering the exposed end of the junction. At least a layer of the film consists essentially of one oxide of an element selected from the group of yttrium, scandium, europium, samarium, terbium, and dysprosium.

10 Claims, 8 Drawing Figures

SEMICONDUCTOR DEVICE PASSIVATED WITH RARE EARTH OXIDE LAYER

This invention relates to semiconductor devices, and more particularly to semiconductor devices having at least one P-N junction with improved insulating films deposited upon predetermined surface portions of the semiconductor substrates.

In various semiconductor devices such as diodes, transistors, integrated circuits or large scale integrated circuits, predetermined surface portions of their semiconductor substrates are generally coated with insulator films in order to protect them against moisture, dirt or other deleterious foreign matters.

As is well known in the art, as these insulator films, silicon dioxide ($SiO_2$) films have been used in most cases. However, such silicon dioxide films have a tendency to absorb such impurity cations as sodium or hydrogen cations ($Na^+$, $H^+$) which are inherently produced in the process of manufacturing the above described semiconductor devices. Such impurity cations have a large mobility in the $SiO_2$ films when voltage is impressed across electrodes of the semiconductor devices. Further, the $SiO_2$ films undergo an electrode reaction with aluminum layers comprising electrodes to form $Al^{3+}$ ions. For this reason, the operating characteristics of semiconductor devices coated with $SiO_2$ insulator films not only vary from one device to the other but also vary with time due to poor stability of the insulator films as will be described later in more detail. In order to prevent the insulator films from absorbing impurity cations having a large mobility therein and to prevent the above described electrode reaction it has been common practice to apply second and third insulator films consisting of silicon nitride ($Si_3N_4$) and or aluminum oxide ($Al_2O_3$) on the $SiO_2$ films so as to increase the stability of the insulator films of the semiconductor devices.

However, with $Si_3N_4$ films it is relatively difficult to form openings through them by etching process which are required to diffuse a P-type or an N-type region in predetermined areas of the surface of the semiconductor substrate or to secure metal electrodes of aluminum, for example, by metallization. In addition, it is necessary to use relatively fast etching speed so that use of $Si_3N_4$ films are not advantageous in mass production. This is because that usually a hot solution of phosphoric acid heated to about 180° C. is used as the etching solution for $Si_3N_4$ films so that a conventional photoresist mask utilized to etch $SiO_2$ films (etching solution therefore ordinally consists of a mixture of hydrofluoric acid and ammonium fluoride) can not be used because such masks are dissolved by phosphoric acid.

Further, as the dielectric constant of $SiO_2$ films is relatively low (about 4), where such an $SiO_2$ film is used as an insulator gate film of a field effect transistor having an insulator gate (hereinafter abbreviated as IGFET) it is essential to decrease the thickness of the $SiO_2$ film in order to increase the amplification factor or the mutual conductance gm of the IGFET. However, such decrease in the thickness of the insulator gate film results in the reduction of the nominal voltage of the IGFET. Further pinholes in the insulator gate film cause insulation breakdown when metal electrodes of aluminum for example are secured to the insulator gate film as by metallization.

It is, therefore, an object of this invention to provide a semiconductor device having at least one P-N junction wherein etching of the insulator film can be more readily performed and the stability of the surface of the semiconductor substrate can be improved. Another object of the invention is to provide a transistor device such as an IGFET wherein the amplification factor or the mutual conductance gm can be increased.

According to this invention, there is provided a semiconductor device including at least one P-N junction wherein at least a portion of the insulator film coated on a predetermined surface portion of a semiconductor substrate made of silicon (Si), germanium (Ge), gallium arsenide (GaAs) or gallium phosphide (GaP), for example, is made of an oxide of at least an element selected from the group consisting essentially of yttrium (Y), scandium (Sc), Europium (Eu), samarium (Sm), terbium (Tb) and dysprosium (Dy).

This invention can be more fully understood from the following detailed description when taken in connection with the accompanying drawings, in which:

FIG. 1 shows a longitudinal section of a high frequency sputtering apparatus suitable for use in the manufacture of the present semiconductor devices;

FIG. 2 diagrammatically shows, partly in section, a vapor phase reaction apparatus suitable for use in the manufacture of semiconductor devices by utilizing the vapor phase reaction;

Figures 1, 3, 5:
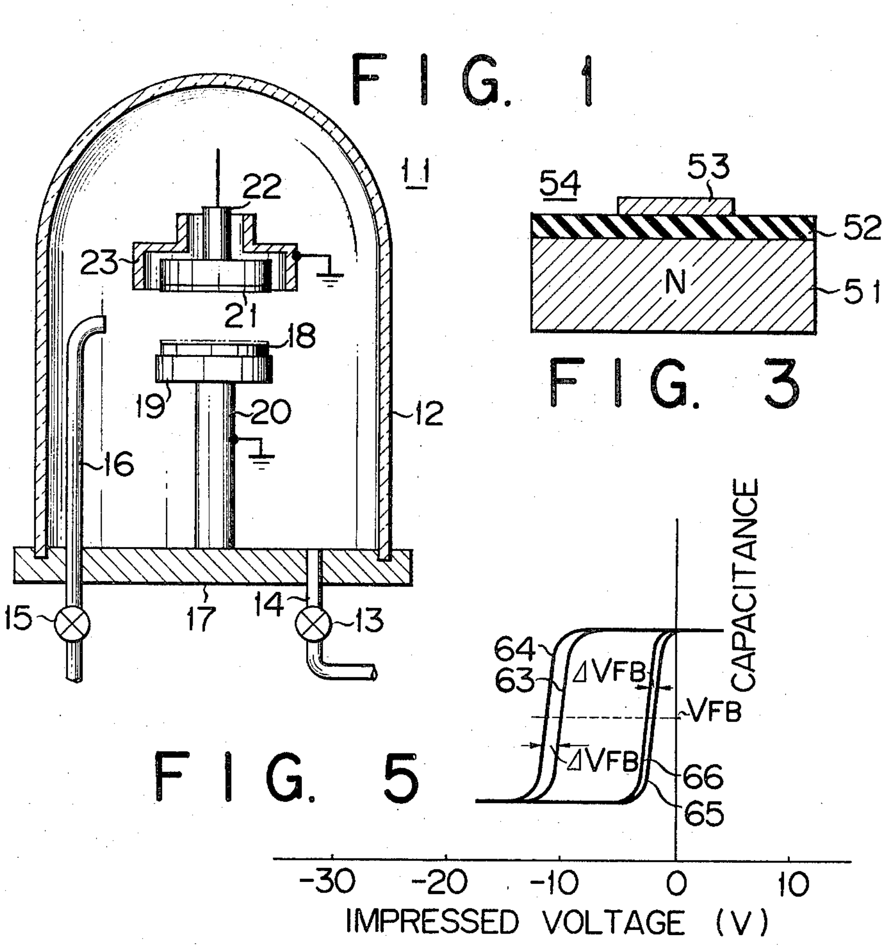
FIG. 3 shows a section of a MIS varactor diode embodying this invention.
FIG. 5 shows a similar curve of a MIS varactor diode fabricated in accordance with this invention.

Referring now to FIG. 1 which shows a longitudinal section of a high frequency sputtering apparatus suitable for use to form an insulator film on a predetermined surface portion of a semiconductor substrate. As shown, the high frequency sputtering apparatus 11 comprises a cup shaped bell jar of quartz glass and the like 12 with its bottom opening hermetically closed by a metal plate 17. An exhaust pipe 14 having a valve 13 and a pipe 16 with a valve 15 for admitting an inert gas such as argon gas extend through the bottom plate 17. A metal pedestal 20 carrying an anode holder 19 is secured to the center of the bottom plate 17 to carry a semiconductor substrate 18 made of silicon, germanium, gallium arsenide or gallium phosphide, for example. The pedestal 20 is grounded as shown and impressed with a suitable positive potential. Spaced from and confronting to the substrate 18 is disposed a cathode target holder 22 and a layer of a material to be sputtered such as yttrium oxide ($Y_2O_3$), scandium oxide ($Sc_2O_3$), europium oxide ($Eu_2O_3$), samarium oxide ($Sm_2O_3$), terbium oxide ($Tb_2O_3$) or dysprosium oxide ($Dy_2O_3$) is secured to the bottom of the cathode target holder 22. The cathode target holder is surrounded by a metal shield 23 or guard ring.

The operation of sputtering material 21 on a predetermined surface area of the semiconductor substrate 18 by utilizing the high frequency sputtering apparatus 11 is as follows. First, the semiconductor substrate 18 is mounted on the anode holder 19 with its surface to be sputtered turned upward. After securing the material 21 to be sputtered on the bottom surface of the target holder 22, the interior of the bell jar 12 is evacuated through the pipe 14 and valve 13 and argon gas is admitted therein through the pipe 15 and valve 16. Then, a high frequency voltage of about 3 KV and the about 10 to 15 MHz is impressed across the anode holder 19 and cathode target holder 22 to establish a glow discharge between them. Cations $Ar^+$ of the argon gas presenting in the glow discharge region are accelerated toward the cathode target holder 22 to bombard the material 21 with sufficient energy. As a result, molecules of the material 21 are sputtered and deposited on the desired region of the surface of the substrate 18 as indicated by dotted lines.

Figures 2, 6, 7, 8:
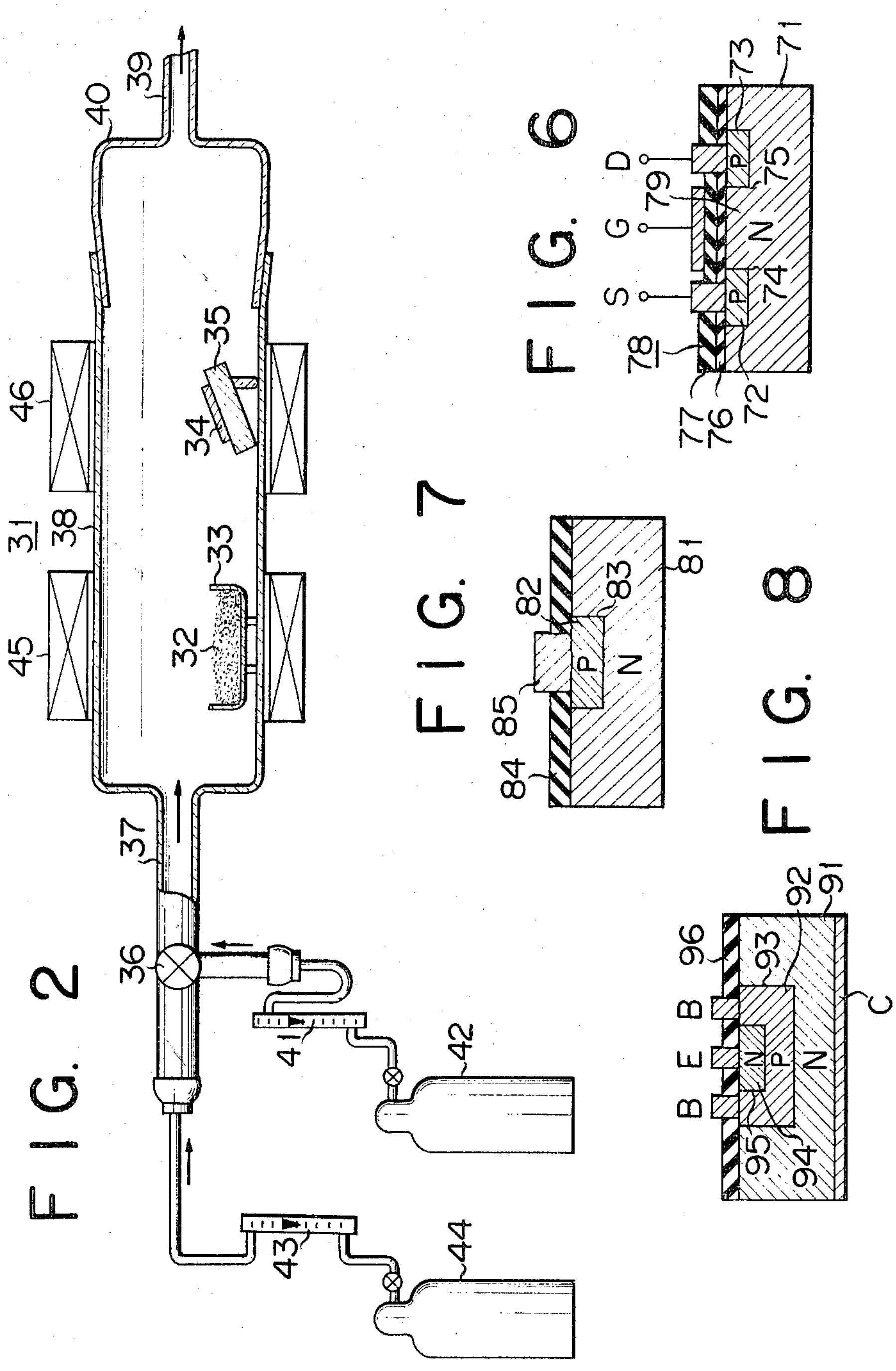
FIG. 6 is a section illustrating one example of an IGFET fabricated according to this invention.
FIG. 7 shows a section of one example of a planar diode fabricated according to this invention.
FIG. 8 shows a section of one example of a planar transistor fabricated according to this invention.

FIG. 2 shows, partly in section, a vapor phase reaction apparatus 31 also suitable for depositing insulator films on the predetermined portions of the surface of semiconductor substrates according to this invention. The reaction apparatus illustrated comprises a horizontal evacuated envelope 38 containing a boat 33 made of heat resistant material such as quartz or graphite, which contains reactant 32 such as a chloride of at least one element selected from the group consisting essentially of yttrium, scandium, europium, samarium, terbium and dysprosium, for example scandium chloride, and an inclined substrate holder 35 which supports a semiconductor substrate 34, and substrate being inclined at a suitable angle, spaced from the boat 33 by a definite distance and facing thereto. One end of the envelope is connected to an inlet pipe 37 including a three-way valve 36 to admit reaction gases to be described later, while the opposite end of the envelope 38 is closed by an end cover 40 having an exhaust pipe 39. One leg of the three-way valve 36 is connected to a source of a reaction gas 42, oxygen for example, via a flow meter 41 and the other leg to a source of carrier gas 44, for example nitrogen, via a flow meter 43. A high frequency heating coil 45 is disposed to surround portions of the evacuated envelope 38 containing the boat 33 and another high frequency heating coil 46 is disposed to surround portions of the envelope containing the substrate holder 35.

It is to be assumed that an insulator film of scandium oxide ($Sc_2O_3$) is to be deposited upon the surface of the semiconductor substrate 34 by utilizing the illustrated vapor phase reaction apparatus 31. First, the three-way valve 36 is operated to introduce the carrier gas, nitrogen for example, into the envelope 38 from the source 44. Meanwhile, air in the envelope 38 is exhausted through exhaust pipe 39 to purge the air with nitrogen gas. Then the three-way valve 36 is manipulated to admit the reaction gas or oxygen into the envelope 38 from its source 42. High frequency heating coils 45 and 46 are suitably energized thus heating the reactant 32 and semiconductor substrate 34 to the required temperatures. Then, the reactant or scandium chloride in this example is vaporized off and the vapor of scandium chloride is permitted to undergo vapor phase reaction with the oxygen gas supplied from its source 42 to form scandium oxide ($Sc_2O_3$) which is deposited on the surface of the semiconductor substrate 34.

The reaction of forming scandium oxide can be expressed by following equations.

$$2ScCl_3 \rightleftharpoons 2Sc^{3+} + 3Cl_2$$
$$2Sc^{3+} + 3O_2 \rightarrow 2Sc_2O_3$$

The vapor pressure of scandium chloride formed as above described is relatively high as shown in the following table 1 so that it is easy to control the deposition speed of the film of scandium oxide on the surface of the semiconductor substrate by varying the heating temperature provided by the high frequency heating coil 45.

TABLE 1

| | | | | | |
|---|---|---|---|---|---|
| Temperature of scandium chloride, ° C | 792 | 855 | 895 | 924 | 955 |
| Vapour pressure of the vapour, mm./hg | 12.0 | 56.9 | 148 | 534 | 612 |

Although in the above example, scandium chloride was shown as the starting material for forming scandium oxide a scandium compound containing an organic radical and undergoes decomposition at a relatively low temperature may be substituted for scandium chloride.

The following specific examples of this invention are given by way of illustration and are not to be construed as limiting in any way the scope and spirit of the invention.

EXAMPLE I

A high frequency sputtering apparatus identical to that shown in FIG. 1 was used and an N-type semiconductor substrate 51 having a thickness of 300 microns and a resistivity of 0.2 ohm-cm was mounted on the anode holder 19. Sputtering material 21 consisting of yttrium oxide ($Y_2O_3$) was secured to the cathode target holder 22. After evacuating the bell jar 12 to a vacuum of about $10^{-6}$ torr through the exhaust pipe 14, argon gas was admitted to a pressure of about $7 \times 10^{-3}$ torr through inlet pipe 16. Under these conditions, a high frequency voltage of about 3 KV and at a frequency of 13.65 MHz was applied across the material 21 to be sputtered and semiconductor substrate 51 for about 10 minutes to deposit a film of yttrium oxide 52 of about 0.2 microns thick on the surface of the semiconductor substrate 51. Aluminum layer was vapor deposited on this film of yttrium oxide 52 by electron beam technique and by utilizing a suitable mask to form an electrode thus providing a metal-insulator semiconductor (MIS) varactor diode 54.

The insulator film 52 consisting of yttrium oxide ($Y_2O_3$) deposited on the surface of the semiconductor substrate 51 is uniform stoichiometrically since in the solid phase yttrium presents only in the form of $Y^{3+}$. Further, since it is very stable chemically when compared with silicon dioxide ($SiO_2$) or aluminum oxide ($Al_2O_3$) it is very suitable for use as surface stabilizing films of various semiconductor devices.

As an example, the stability of a MIS varactor diode having an insulator film consisting of only a conventional silicon dioxide layer and that of a similar varactor diode having a silicon dioxide layer and a film of yttrium oxide deposited thereon by the high frequency sputtering technique were compared by the bias temperature (BT) treatment dependency of the capacitance-voltage (c - v) characteristics, which is usually employed to evaluate the stability of such insulator films. The results obtained are depicted in FIGS. 4 and 5.

According to the bias temperature treatment, a semiconductor device having above described insulator film deposited on the surface of a semiconductor substrate, a MIS varactor diode for example, is immersed in an aqueous solution of sodium chloride (NaCl) to contaminate the insulator film with sodium, and a predetermined voltage is impressed upon an electrode mounted on the insulator film at a predetermined temperature to determine the mobility of ions through the insulator film, the migration of such ions being observed as the shift of the so-called flat band voltage $V_{FB}$.

Figure 4:
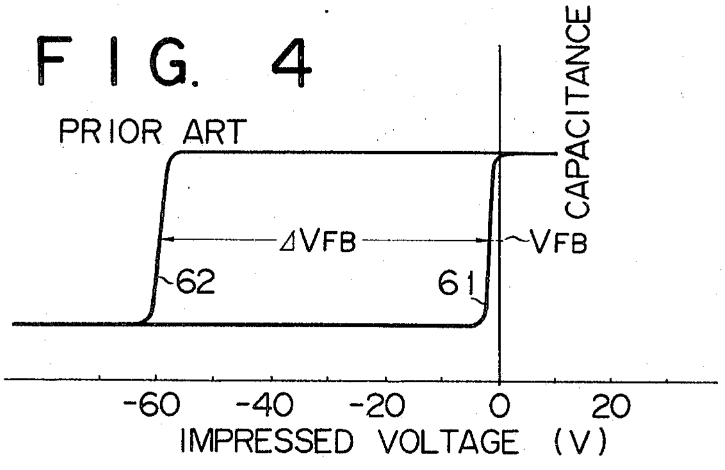
FIG. 4 shows a capacitance vs. impressed voltage characteristic curve of a prior art MIS varactor diode.

As shown in FIG. 4, in the conventional MIS varactor diode having an insulator film consisting of a single layer of silicon dioxide the flat band voltage was initially about −1.5 V as shown by curve 61. However, as will be described later in more detail when subjected to the bias temperature treatment, in accordance with this invention, the flat band voltage has shifted to about −60 V as shown by curve 62. Such a wide range of shift $\Delta V_{FB}$ of the flat band voltage in this example $[-1.5 - (-60V) = 58.5\ V]$ results in not only in large variations in the capacitance with time at a predetermined operating point of the MIS varactor diode but also a large difference in the operating characteristics between discrete MIS varactor diodes.

In contrast, in the MIS varactor diode having a silicon dioxide film and a yttrium oxide film overlaying the same, the first flat band voltage $V_{FB}$ shifts to −10 V as shown by curve 63 in FIG. 5 from a value of −1.5 V of the varactor diode having a silicon dioxide film alone where the yttrium oxide film was deposited on the silicon dioxide film by the high frequency sputtering technique. The shift of said first flat band voltage $V_{FB}$ is caused by sputtering damage. However, where a voltage of +15 V is impressed upon an electrode on the insulator films and the varactor diode is subjected to the bias temperature treatment for 15 minutes at a temperature of about 150° C. the shift of the flat band voltage is only about −2 V as shown by curve 64 of FIG. 5. Thus, it is clear that the range of shift of the flat band voltage $\Delta V_{FB}$ is greatly decreased when compared with that of the conventional insulator film consisting of only one film of silicon dioxide. When the insulator film consisting of a silicon dioxide film and an yttrium oxide film deposited thereon by the high frequency sputtering technique is heat treated in oxygen atmosphere for about 10 minutes at a temperature of 1,000° C. prior to the bias temperature treatment, the initial flat band voltage is about −2 V as shown by curve 65 which is nearly equal to the value of that of the varactor diode having a silicon dioxide film alone. After the bias temperature treatment, the flat band voltage shows a value of about −2.5 V as shown by curve 66, thus further narrowing the range of shift of the flat band voltage $\Delta V_{FB}$. Thus, with the semiconductor devices having such double layered insulator films, even when cations of sodium or hydrogen are absorbed in the insulator films the films are very stable against these cations. In addition, they are very stable against electrode reaction described above. Especially, those subjected to the above described surface treatment manifest excellent surface stabilizing action. It is considered that the reason for the excellent surface stability of the heat treated varactor diode can be attributed to the fact that although the semiconductor surface subjected to the high frequency sputtering is damaged, such damage can be recovered by the heat treatment. In addition to yttrium, other elements such as scandium which are employed in this invention have substantially the same surface stabilizing function. Different from silicon nitride film, insulator films of this invention consisting of yttrium oxide, scandium oxide, europium oxide, samarium oxide, terbium oxide, dysprosium oxide, mixtures thereof or compounded layers thereof can be readily etched by such etchant as phosphoric acid, hydrochloric acid, nitric acid or sulfuric acid at room temperature so that they can be perforated by etching operation with the use of conventional photoresist masks to form openings through insulator films which are utilized to diffuse P-type or N-type regions in the predetermined areas of the surface of the substrates or to secure metal electrodes of aluminum for example by metallization on the surface of the substrates. Thus, these insulator films can be more readily etched at higher speed which is advantageous from the standpoint of mass production.

In addition to the above described high frequency sputtering and vapor phase reaction processes, the insulator films can also be formed by other conventional methods such as anodic oxidation, high temperature oxidation, plasma oxidation and the vapor deposition method utilizing an electron beam.

The following Table 2 shows a comparison between the flat band voltage $V_{FB}$, the ranges of shift of the flat band voltages $\Delta V_{FB}$ caused by the bias temperature treatment, insulating strength and dielectric constants of insulator films and etching speeds of Examples 1 to 17 of the MIS varactor diodes according to the present invention comprising various combinations of different semiconductor substrates, different types of insulator films and different method of manufacturing the same and of two examples of the prior art MIS varactor diodes. In this Table 2, all etching speeds were determined by using the same phosphoric acid solution maintained at a temperature of 50° C.

ing apparatus while Example 9 was fabricated by depositing an insulator film of $Sc_2O_3$ on the surface of a silicon semiconductor substrate by the same vapor phase reaction apparatus as that shown in FIG. 2. Example 10 was fabricated by depositing an insulator film of $Sc_2O_3$ on the surface of a silicon substrate by the anodic oxidation. Example 11 was fabricated by depositing an insulator film of $Sc_2O_3$ on the surface of a gallium arsenide substrate by the same high frequency sputtering apparatus as that shown in FIG. 1 and Example 12 was fabricated by depositing an insulator film of $Sc_2O_3$ on a germanium semiconductor substrate by the same high frequency sputtering apparatus. Example 13 was fabricated by first depositing a film of $Eu_2O_3$ on the surface of a germanium semiconductor substrate by the same vapor phase reaction apparatus as that shown in FIG. 2 followed by the deposition of an overlaying film of $Sc_2O_3$ by the same high frequency sputtering apparatus as that shown in FIG. 1. Example 14 was fabricated by first depositing an insulator film of $Sc_2O_3$ on a germanium semiconductor substrate by the same high frequency sputtering apparatus as that shown in FIG. 1 and then depositing a second insulator film of $Sm_2O_3$ by the vapor phase reaction apparatus as that shown in FIG. 2. Example 15 corresponds to the diode shown by curves 63 and 64 in FIG. 5 whereas Example 16 to the diode shown by curves 65 and 66 in FIG. 5. Example 17 was fabricated by dipositing a single insulator film consisting of a mixture of $Y_2O_3$ and $SiO_2$ on the surface of a silicon semiconductor substrate with the same high frequency sputtering apparatus as that shown in FIG. 1.

Prior art Example 1 was fabricated by depositing an insulator film of $SiO_2$ on the surface of a silicon semiconductor substrate by the high temperature oxidation method whereas prior art Example 2 was fabricated by depositing an insulator film of $Si_3N_4$ on the surface of a silicon semiconductor substrate by the same vapor phase reaction.

Thus, as can be clearly noted from Table 2 MIS varactor diodes having the insulator films of various types are extremely stable against impurity cations such as sodium and hydrogen cations as well as against electrode reactions when compared with conventional MIS varactor diodes having a single layer of $SiO_2$. Further, the etching speed of the insulator films for forming openings is very fast.

TABLE 2.—MIS VARACTOR DIODE

| Example | Condition | | | Characteristics | | | | |
|---|---|---|---|---|---|---|---|---|
| | Substrate material | Insulator film | Method of man. insulator | $V_{FB}$ (v). | $\Delta V_{FB}$ (v.) | Insulating strength (v./cm.) | Dielectric constant | Etching speed (A./sec.) |
| 1 | Si | $Y_2O_3$ | H.F. sputtering | −6 | 0.5 | $5\times10^6$ | 14 | 200. |
| 2 | Si | $Sc_2O_3$ | do | −6 | 1 | $5\times10^6$ | 14 | 200. |
| 3 | Si | $Eu_2O_3$ | do | −6 | 1 | $5\times10^6$ | 14 | 200. |
| 4 | Si | $Sm_2O_3$ | do | −6 | 1 | $5\times10^6$ | 14 | 200. |
| 5 | Si | $Tb_2O_3$ | do | −6 | 1 | $5\times10^6$ | 14 | 200. |
| 6 | Si | $Dy_2O_3$ | do | −6 | 1 | $5\times10^6$ | 14 | 200. |
| 7 | Si | $Sc_2O_2$, $Eu_2O_3$ | do | −6 | 1 | $5\times10^6$ | 14 | 200. |
| 8 | Si | $Sm_2O_3$, $Tb_2O_3$, $Dy_2O_3$ | do | −6 | 1 | $5\times10^6$ | 14 | 200. |
| 9 | Si | $Sc_2O_3$ | Vapour phase reaction | −5 | 1 | $5\times10^6$ | 14 | 200. |
| 10 | Si | $Sc_2O_3$ | Anodic oxidation | −2 | 0.5 | $10^7$ | 14 | 100. |
| 11 | GaAs | $Sc_2O_3$ | H. F. sputtering | −2 | 0.5 | $10^7$ | 14 | 100. |
| 12 | Ge | $Sc_2O_3$ | do | −50 | 6 | $5\times10^6$ | 14 | 200. |
| 13 | Ge | $Eu_2O_3$, $Sc_2O_3$ | Vapour phase reaction H. F. sputtering | −20 | 6 | $5\times10^6$ | 14 | 200. |
| 14 | Ge | $Sc_2O_3$, $Sm_2O_3$ | H. F. sputtering vapour phase reaction | −6 | 1 | $5\times10^6$ | 12 | 200. |
| 15 | Si | $SiO_2$, $Y_2O_3$ | High temp. oxidation H. F. sputtering | −6 | 3 | $5\times10^6$ | 12 | 200. |
| 16 | Si | $SiO_2$, $Y_2O_3$ | do | −10 | 2 | $8\times10^6$ | 10 | 200. |
| 17 | Si | Mixture $Y_2O_3$ and $SiO_2$ | H. F. sputtering | −2 | 0.5 | $8\times10^6$ | 12 | 200. |
| Prior art: | | | | −6 | 1 | $8\times10^6$ | 10 | 50. |
| 1 | Si | $SiO_2$ | High temp. oxidation | −1.5 | 30 | $10^7$ | 4 | 1 A./min. |
| 2 | Si | $Si_3N_4$ | Vapour phase reaction | −20 | 0.1 | $10^7$ | 7 | 10 A./min. |

Examples 1 to 6 were fabricated by depositing on the surface of silicon semiconductor substrates insulator film of $Y_2O_3$, $Sc_2O_3$, $Eu_2O_3$, $Sm_2O_3$, $Tb_2O_3$ or $Dy_2O_3$, respectively by a high frequency sputtering apparatus identical to that shown in FIG. 1, and Example 7 was fabricated by sequentially depositing films of $Sc_2O_3$ and $Eu_2O_3$ on the surface of a silicon semiconductor substrate by the same high frequency sputtering apparatus. Example 8 was fabricated by sequentially depositing three films of $Sm_2O_3$, $Tb_2O_3$ and $Dy_2O_3$ on a silicon semiconductor substrate, by the same high frequency sputter- FIG. 6 shows a section of one example of an IGFET fabricated in accordance with this invention, which is formed by diffusing a P-type source region 72 and a drain region 73 in spaced agent areas of the surface of an N-type silicon semiconductor substrate 71, then forming a $SiO_2$ film 76 having a thickness of about 800 A on the substrate by the high temperature oxidation method so as to cover at least ends exposed on the surface of the substrate of two junctions 74 and 75 formed at the respective interfaces between the source region 72, drain region 73 and the substrate 71 and finally forming a film of $Y_2O_3$ 77 having a thickness of about 1,500 A on the $SiO_2$ film by the high frequency sputtering method thus forming a double layered insulator film structure 78. A gate electrode G of aluminum is applied onto the insulator film structure 78 covering an electric conductive channel 79 extending between the source region 72 and the drain region 73. Portions of insulator films above the source region 72 and the drain region 73 are etched off to form openings to secure a source electrode S and a drain electrode D, respectively, made of aluminum for example.

As shown in Table 2, since the dielectric constant of $Y_2O_3$ is high, in the IGFET fabricated as above described, it is possible to make large the mutual conductance gm of the device when compared with a conventional single layer of $SiO_2$ usually having a thickness of 800 to 900 A even when the thickness of the insulator film is somewhat larger. In addition, insulation breakdown due to pinholes can be positively precluded at the time of forming the gate electrode, which is especially significant with the two layered construction of the insulator film structure. It is to be understood that any one of many insulator films of this invention shown in Table 2 can be used to fabricate the insulator film structure 78.

FIG. 7 shows a section of one example of a planar diode constructed in accordance with this invention. Such a diode is fabricated by the steps of diffusing a P-type region 82 in a portion of the surface of an N-type silicon semiconductor substrate 81, for example, depositing an insulator film 84 which may be any one of many types shown in Table 2 to cover at least the exposed end of the junction 83 at the interface between the P-type region 82 and the N-type substrate 81, etching the insulator film 84 above the P-type region 82 to form an opening and securing an electrode 85 of aluminum to the P-type region 82. The planar diode fabricated in this manner and provided with an insulator film which may be any one of many different types shown in Table 2 has not only excellent surface stability but also a higher reverse breakdown voltage than similar diodes having a single insulator film of $SiO_2$, for example.

FIG. 8 shows a section of one example of a planar transistor fabricated in accordance with this invention comprising the steps of diffusing a P-type base region 92 in an area of the surface of an N-type silicon semiconductor substrate 91 for example, diffusing an N-type emitter region 93 in a portion of the base region 92 and applying an insulator film 96 which may be any one of the insulator films shown in Table 2 to cover exposed ends of junctions 94 and 95 respectively formed at the interfaces between substrate 91 and base region 92, and base region 92 and emitter region 93. Then an emitter electrode E, a base electrode B and a collector electrode C are secured. Similar to the planar diode shown in FIG. 7, the planar transistor shown in FIG. 8 has a higher reverse breakdown voltage than prior planar transistors. This is also true for other types of transistors such as a mesa type.

What we claim is:

1. In a semiconductor device comprising a semiconductor substrate of one conductivity type, at least one P-N junction dividing said semiconductor substrate into at least two regions, said junction being formed at the interface between adjacent regions, the end of said junction being exposed to the surface of said substrate, and an insulating film covering the exposed end of said junction, the improvement comprising at least one layer of said insulating film consisting essentially of at least one oxide selected from the group consisting of $Y_2O_3$, $Sc_2O_3$, $Sm_2O_3$, $Tb_2O_3$, and $Dy_2O_3$.

2. A semiconductor device according to claim 1 wherein said insulator film consists of a single layer of oxide.

3. A semiconductor device according to claim 1 wherein said insulator film includes a plurality of layers at least one of the layers consists of yttrium oxide.

4. A semiconductor device according to claim 1 wherein said device is a diode having a region of a conductivity type opposite to that of said semiconductor substrate formed within said substrate, and an electrode secured to said region.

5. A semiconductor device according to claim 1 wherein said insulator film comprises a first layer of $SiO_2$ and a second layer overlaying said first layer, said second layer comprises an oxide film essentially consisting of at least one oxide selected from the group consisting of $Y_2O_3$, $Sc_2O_3$, $Sm_2O_3$, $Tb_2O_3$ and $Dy_2O_3$.

6. A semiconductor device according to claim 1 wherein said insulator film comprises a single layer of oxide film essentially consisting of at least one oxide selected from the group consisting of $Y_2O_3$, $Sc_2O_3$, $Sm_2O_3$, $Tb_2O_3$ and $Dy_2O_3$.

7. A semiconductor device according to claim 1 wherein said insulator film comprises a plurality of layers, and at least one of said layers comprises an oxide layer essentially consisting of at least one oxide selected from the group consisting of $Y_2O_3$, $Sc_2O_3$, $Sm_2O_3$, $Tb_2O_3$ and $Dy_2O_3$.

8. A semiconductor device according to claim 1 wherein said insulating film comprises a first layer of silicon dioxide formed on a main surface of said semiconductor substrate, a second layer formed on said first layer and comprised of an oxide layer selected from the group essentially consisting of $Y_2O_3$, $Sc_2O_3$, $Sm_2O_3$, $Tb_2O_3$, and $Dy_2O_3$, and a third layer overlying said second layer and selected from the group consisting of $SiO_2$ and $Si_3N_4$.

9. A semiconductor device according to claim 1 which comprises an insulated-gate field effect transistor consisting of a source region and a drain region each formed in spaced relationship on said substrate and of opposite conductivity type thereto; a conduction channel formed in the substrate so as to be disposed between the source and drain regions; PN junctions formed between the substrate and the source region as well as between the substrate and the drain region to define interfaces therebetween respectively, said junction having the respective opposite ends exposed on the surface of the substrate and covered with said insulator film which in turn covers the surface portion of the substrate facing at least the conduction channel; source and drain electrodes secured to the source and drain regions respectively; and a gate electrode secured to the insulator film portion facing the conduction channel.

10. A semiconductor device according to claim 1 which comprises a planar transistor consisting of a base region formed within a substrate, said substrate acting as a collector region, said base region being of opposite conductivity type thereto, and an emitter region formed within the base region and of the same conductivity type as that of the substrate; P-N junctions formed between the substrate and the base region as well as between the base and emitter regions respectively, said junctions having the respective opposite ends exposed on one surface of the substrate and covered with said insulating film; and base and emitter electrodes secured to the base and emitter regions respectively, and a collector electrode secured to the other surface of the substrate.

* * * * *